United States Patent
Smith

(10) Patent No.: US 6,768,385 B2
(45) Date of Patent: Jul. 27, 2004

(54) INTELLIGENT PHASE LOCK LOOP

(75) Inventor: Sterling Smith, Hsinchu (TW)

(73) Assignee: MStar Semiconductor, Inc., Hsinchu Hsien (TW)

(*) Notice: Subject to any disclaimer, the term of this patent is extended or adjusted under 35 U.S.C. 154(b) by 92 days.

(21) Appl. No.: 10/139,689

(22) Filed: May 2, 2002

(65) Prior Publication Data
US 2002/0167365 A1 Nov. 14, 2002

Related U.S. Application Data

(60) Provisional application No. 60/290,475, filed on May 11, 2001.

(51) Int. Cl.[7] .................................................. H03L 7/00
(52) U.S. Cl. .......................... 331/1 A; 331/25; 331/20; 331/DIG. 2; 375/376; 348/708; 348/572; 348/571
(58) Field of Search ............................ 331/1 A, 25, 20, 331/DIG. 2; 375/376; 348/708, 571, 572

(56) References Cited

U.S. PATENT DOCUMENTS 6,028,488 A * 2/2000 Landman et al. ........... 331/1 A

* cited by examiner

Primary Examiner—Arnold Kinkead
(74) Attorney, Agent, or Firm—J. C. Patents

(57) ABSTRACT

A PLL architecture with fast phase acquisition, a stable freerun output frequency, and post-freerun fast phase recovery. The invention is particularly well suited for use in a video graphics a/d conversion circuit. An intelligent phase lock loop is optimized to determine the time difference between the closest rising edge of an PLL output signal and the rising edge of an input signal. The time difference in combination with the current PLL lock state determine an operational code used in a digital signal processing loop filter used to control a digitally controlled oscillator. The PLL also provides a stable output frequency during freerun periods, and a phase booster circuit for post-freerun fast phase recovery.

7 Claims, 5 Drawing Sheets

INTELLIGENT PHASE LOCK LOOP

CROSS-REFERENCE TO RELATED APPLICATION

This application claims the priority benefit of U.S. provisional application titled "INTELLIGENT PHASE LOCK LOOP" filed on May 11, 2001, Ser. No. 60/290,475. All disclosures of this application is incorporated herein by reference.

BACKGROUND OF INVENTION

1. Field of the Invention

The present invention relates to a phase lock loop, and more particularly, to a phase-lock loop with fast phase acquisition, a stable freerun output frequency, and post-freerun fast phase recovery.

2. Description of Related Art

Phase lock loops are common circuits used in electronic circuits for frequency synthesis, duty-cycle enhancement, and clock de-skewing. A preferred embodiment of the invention utilizes a PLL in a video-graphics analog-to-digital conversion circuit. Currently most personal computers utilize video cards that convert digital signals into RGB analog signals for displaying graphics on CRT monitors. It is therefore necessary for flat-panel displays to be able to interface with current video graphics systems. FIG. 1 shows a typical computer-flat-panel configuration. The flat-panel display requires an analog interface 30 to change the analog RGB signals into the digital signals required by the display. Computer graphics cards use RAMDACs which are configured at a pixel rate based on the resolution of the screen to convert the digital signals from the computer into an analog 256-level pulse amplitude modulated signal which are transmitted along with timing signals to the analog interface 30. The analog interface receives the analog graphics data and uses ADCs to convert the data back into a digital format. In order for this to occur though the interface must recover the original pixel clock frequency and phase correctly using a clock regenerator. The clock regenerator recreates the pixel clock by using a frequency-multiplying PLL utilizing an HSYNC signal as the reference frequency. The outputted signal from the clock regenerator is then outputted to the ADCs, and the graphics controller 40.

Many current circuits for this application use an analog PLL consisting of a voltage controlled oscillator VCO. In an application for capturing analog RGB signals and digitizing them for display on a flat-panel monitor the current designs have many limitations. The HSYNC signal used as a reference signal for pixel clock recovery is not a jitter-free signal where the amount of jitter on the signal will depend on the type of graphics card used in the computer. Most analog PLL deal with this jitter by narrowing the loop bandwidth, however this also makes it difficult to correct long term jitter effects. Further in a composite HSYNC format the VSYNC signal is embedded onto the HSYNC signal. To compensate for HSYNC variations caused by the VSYNC signal the PLL will coast, or in other words attempt to keep the control voltage for the VCO at a constant level. However in an analog PLL design often the control voltage will undesirably drift due to leakage, causing an unacceptable "tearing" effect often seen in the top left-hand corner of the display. In order to keep PLL loop stability at a maximum many designs make use of large off-chip loop filter capacitors. These components however are very susceptible to external noise interference.

Further most conventional phase detectors used in PLL are binary early/late in digital case, or up/down pulse width in analog systems. Binary PLL leads to an ambiguity of 1 clock signal during phase acquisition. To exemplify with reference to FIG. 3, when the rising edge of the REF_CLK occurs between the rising edges of clocks 0 and 1 of the DCO_CLK, the system is unable to determine which DCO_CLK rising edge the REF_CLK rising edge is closest too. The system may therefore select the signal shown in Ex. 1 or in Ex. 2., however as can be seen $T_1 < T_0$ hence Ex. 2 is the more accurate timing signal. This ambiguity can slow down phase acquisition, or even cause temporary loss of lock in some cases.

A further limitation of complex analog PLL is the difficulty in implementing its design into a low cost CMOS process.

Therefore a need exists for a PLL that can be used in low cost CMOS process, can compensate for reference signal jitter, has fast phase acquisition, and can maintain a stable frequency during a coast period due to a VSYNC signal.

SUMMARY OF THE INVENTION

It is therefore an object of the present invention to provide a Phase Lock Loop with intelligent phase detection and correction, allowing phase acquisition to occur quickly and accurately.

It is another object to provide a PLL with a stable output frequency during reference signal fluctuations, and post-freerun fast phase recovery.

It is another objective to provide a PLL with high immunity to clock jitter whether it be reference signal jitter, or system noise.

It is an object to provide a PLL that can be easily incorporated into a low cost CMOS process.

To further accomplish these and other objects of the present invention, a novel PLL structure architecture is utilized. The PLL is composed of an intelligent phase detector that can more accurately determine the position of a rising edge of an input signal for faster phase acquisition. As well the phase detector in combination with a lock detector determines the correct operational codes sent to a loop filter which utilizes digital signal processing to control the frequency of a digitally controlled oscillator. The DCO as described in a co-pending application has high immunity to signal jitter and noise. Utilizing a DCO in the design has the further advantage of easily and solidly locking the output frequency at a required value during a HOLD condition. The output of the oscillator is counted and compared with the input signal. The invention also provides an improved method for maintaining output clock stability during input reference signal flucuations. A coast signal is applied issuing a HOLD condition in the loop filter and DCO. After the input reference signal fluctuations have ended, the coast signal is removed and a phase booster allows for faster phase reacquisition.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
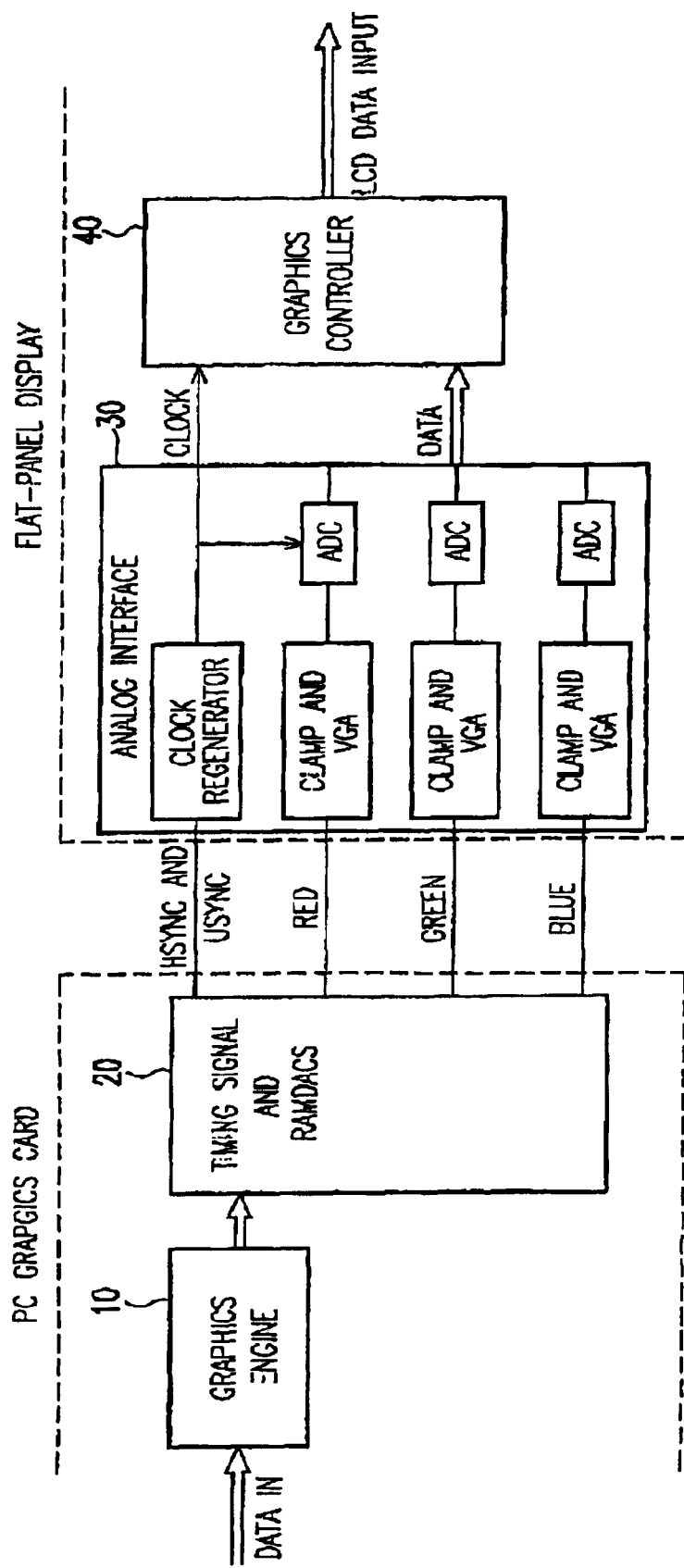
FIG. 1 is a schematic diagram of a configuration of a PC graphics card and a flat-panel display monitor of the prior art.
Figure 2:
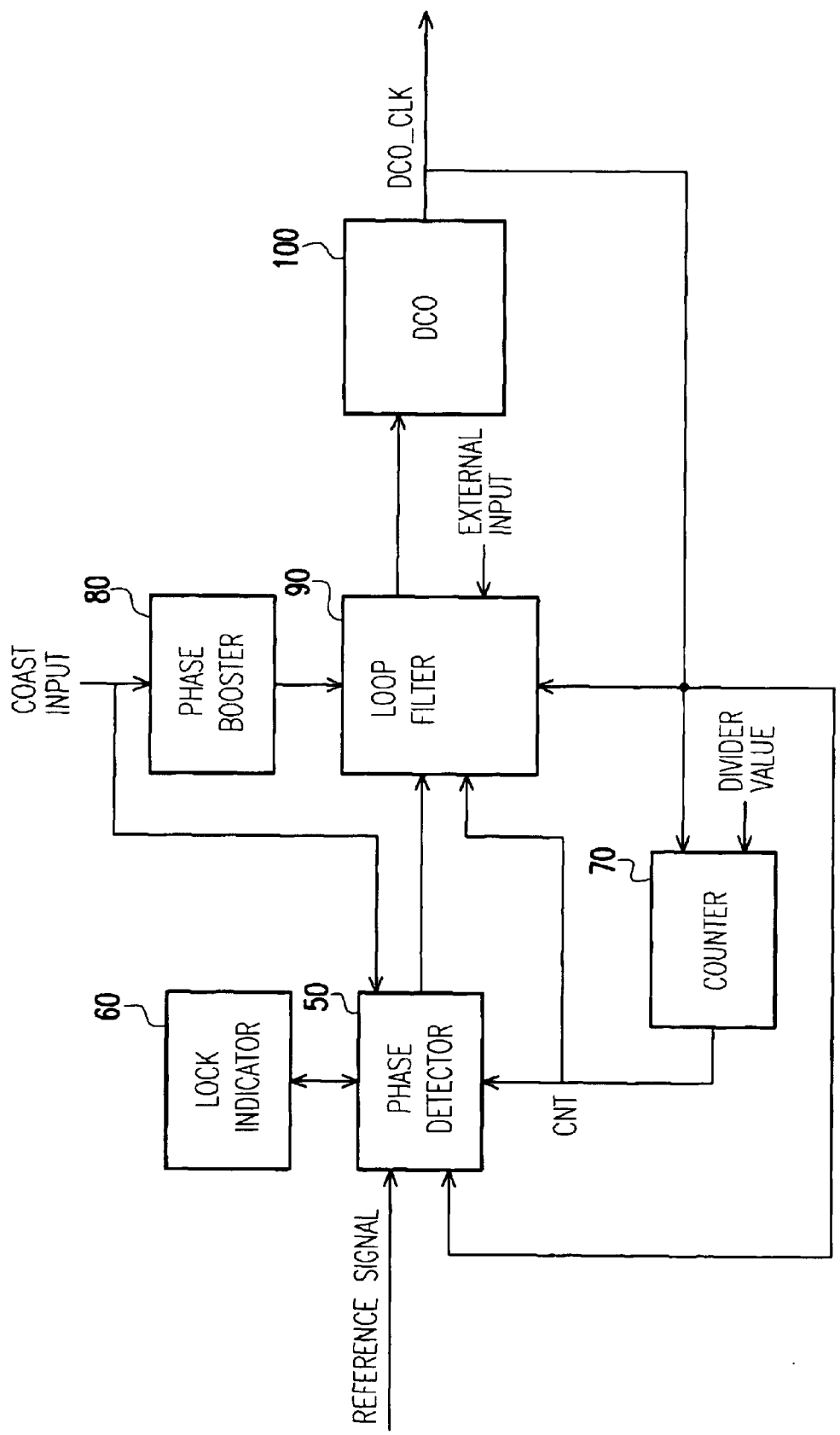
FIG. 2 is a schematic diagram of the architecture of the PLL of the present invention.

FIG. 2 shows a preferred embodiment of the invention. Phase detector 50 is inputted with a reference signal and a signal from the output of the DCO 100. The phase detector 50 has an input and output connected to a digital lock indicator 60. A coast signal is inputted to the phase detector 50, and a phase booster 80. The phase detector 50 is also inputted with the output of a counter 70. The phase detector 50 outputs operational codes to a digital signal processing loop filter 90. The loop filter has programmable coefficients which can be adjusted dynamically by the op-codes transmitted from the phase detector, the phase booster, or an external user control. The loop filter 90 has additional inputs from the counter 70, the output of the DCO 100, and an external input. The loop filter 90 outputs control signals to the DCO 100. The DCO 100 provides an output clock signal DCO_CLK and provides the inputs as described and additionally an input to the counter 70. The DCO 100 used in the invention is described in co-pending application which is incorporated by reference. The DCO circuit has a high resolution input provided by the loop filter. A quantizer (not shown) forces any error into higher frequencies which are subsequently removed by a filter that is inherent in the oscillator frequency of phase conversion. A low-resolution input then controls a DCO which acts as a phase filter. This design serves to remove much of the unwanted jitter and noise from the output frequency created.

Figure 3:
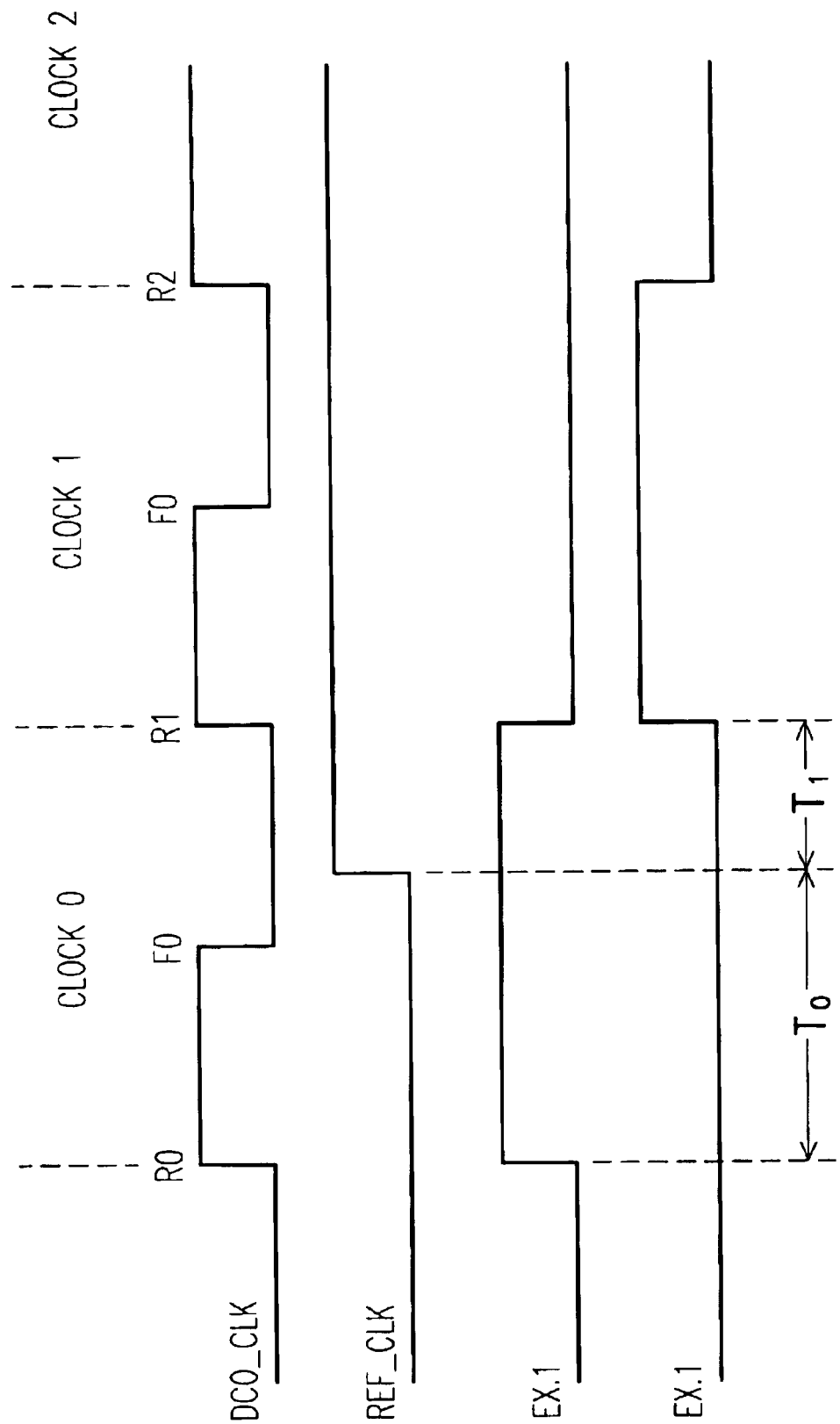
FIG. 3 is a time chart showing the operation of the PLL of the present invention.

The operation of the PLL will now be described in greater detail. A reference signal is inputted to the phase detector 50 and compared with the output of the DCO 100. The phase detector 50 controls the loop filter 60 update operation by transmitting operational codes (op-codes). The op-codes transmitted by the phase detector 50 depend on the time difference between the clock edge of the reference signal and the Nth clock edge of the output from the DCO. The time difference is measured by the value of the counter 70 when the phase detector 50 detects the clock edge of the input reference signal. The counter 70 counts the number of clock cycles in a reference cycle, and is responsive to the inputted divide signal for externally or internally adjusting the CNT value, and therefore the output clock signal. In judging the position of the REF_CLK rising edge in comparison with the rising edges of the DCO_CLK, the system makes use of the falling edges of the DCO_CLK. Referring to FIG. 3, since the REF_CLK rising edge occurs after the falling edge F0, the system can determine that the rising edge of the REF_CLK is closest to R1 of the DCO_CLK. With the removal of the clock ambiguity, phase acquisition can occur more quickly.

Figure 4:
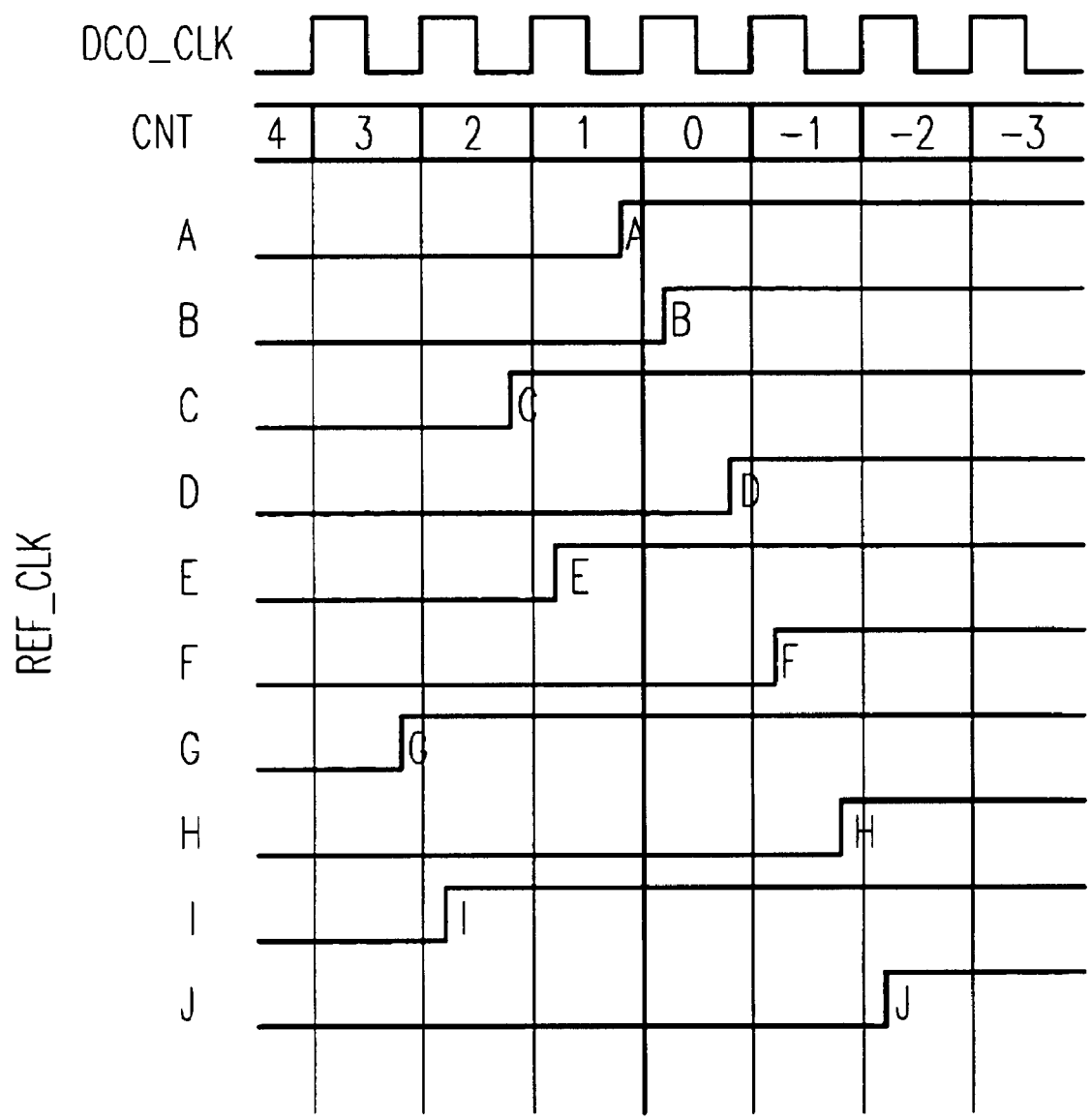
FIG. 4 is a time chart showing different examples of the PLL of the present invention.

The transmitted op-codes will also depend on the lock state of the PLL which is determined by the lock indicator 60. Three possible lock states can occur: LOCK, WARN, and UNLOCKED. A LOCK state occurs when a predetermined number of cycles occur with no faults. A WARN states occurs when the PLL is in a LOCK state and a fault occurs. An UNLOCKED state occurs when the PLL is in a WARN state and a fault occurs. A fault is defined by the phase detector when the time difference measured by the phase detector is more than 1 clock cycle. These lock states in combination with the time difference between the reference and output will determine the op-code sent to the loop filter 90. The op-codes that can be sent include UP, DN, FREQH, FREQL, and HOLD. A transmitted UP op-code will make small adjustments to the frequency to make the CNT value higher when the next reference signal edge occurs. A transmitted DN op-code makes a small adjustment to the frequency to make the CNT value lower when the next reference signal edge occurs. A transmitted FREQH op-code will occur when the phase detector indicates a large difference between the input and output clocks indicating that the DCO frequency is too high, therefore changing the frequency to a lower value in relation to the CNT value. A transmitted FREQL op-code will occur when the phase detector indicates a large difference between the input and output clock indicating that the DCO frequency is too low, therefore changing the frequency to a higher value in relation to the CNT value. Finally a HOLD op-code can be issued that will lock the loop filter and DCO at its current frequency and phase. Therefore in reference to FIG. 4, the following possible decisions can be made:

During a LOCK state for A in FIG. 4: The DCO_CLK phase lags so an UP op-code is transmitted During a LOCK state for B in FIG. 4: The DCO_CLK phase leads so DN op-code is transmitted.

During a LOCK state for C to J other in FIG. 4: reset CNT to re-align, and hold frequency.

During a WARN state for C or D in FIG. 4: The DCO_CLK phase lags, the CNT is reset to re-align, and an UP op-code is transmitted.

During a WARN state for E or F in FIG. 4: DCO_CLK phase leads, the CNT is reset to re-align, and a DN op-code is transmitted.

During an UNLOCKED state for A or B in FIG. 4: UP or DN op-codes are transmitted.

During an UNLOCKED state for C to J other in FIG. 4: reset CNT to re-align, adjust frequency proportionally using FREQL and FREQH op-codes.

Figure 5:
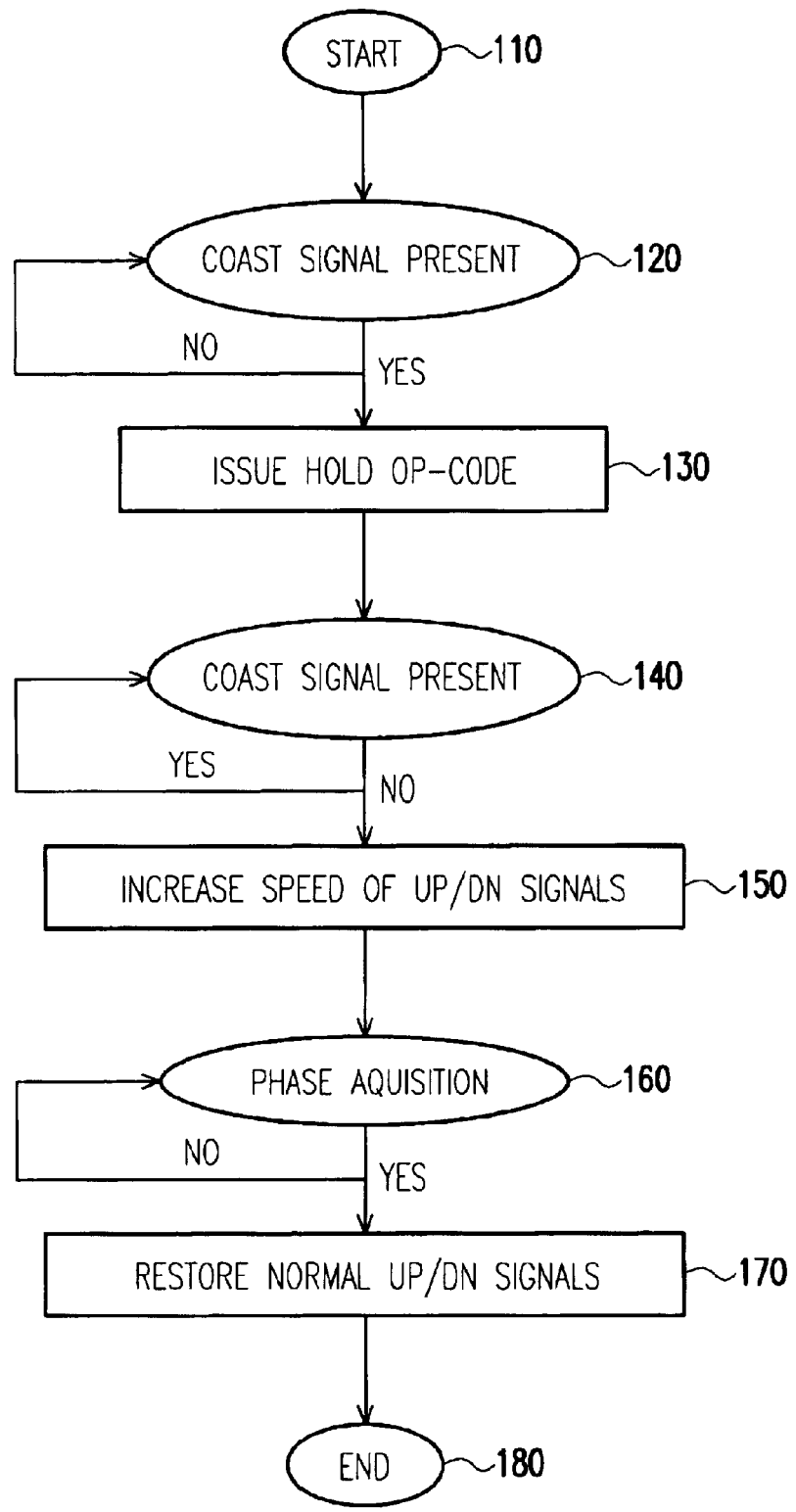
FIG. 5 is a flowchart exemplifying the method when fluctuations in the reference signal occur.

In a composite HSYNC signal sent by a PC-graphics adapter, a VSYNC signal will occur periodically identifying the beginning of a new frame. The VSYNC signal will therefore disturb the HYSNC signal used as a reference for the PLL, and left unchecked the PLL will attempt to follow the reference signal deviation. FIG. 5 shows a diagram illustrating the steps used. When the HSYNC misses 1 or more periods or has some systematic temporal change (eg. during a VSYNC period) then an asynchronous COAST signal is asserted (step 110) originated from external or internal means. This causes the phase detector 50 to issue a HOLD op-code to the loop filter 90 (step 120). As long as the HOLD op-codes are asserted during a LOCK or WARN state, the output DCO clock frequency will be held and not change frequency or phase in response to the reference signal until the HSYNC signal returns. If the coast signal and HOLD op-codes are asserted for a long time, a small frequency error in the DCO 100 will cause the DCO_CLK signal to drift in relation to a HSYNC reference signal. After the coast signal is removed the phase booster 80 will cause the loop filter to temporarily increase the effect of the UP/DN op-codes by changing the loop filter co-efficients. This allows the phase to more quickly realign with the reference HSYNC signal (steps 140 & 150). This ensures that the phase of DCO_CLK is correct by the time it is needed again. When the phase is reacquired the UP/DN op-codes are again issued as normal (steps 160 & 170).

Various additional modifications may be made to the illustrated embodiments without departing from the spirit and scope of the invention. Therefore, the invention lies in the claims hereinafter appended.

What is claimed:

1. A phase lock loop comprising:
   a digitally controlled oscillator for creating an oscillating signal;
   a counter that is coupled to the digitally controlled oscillator for determining a period of the oscillating signal of the digitally controlled oscillator in comparison with a reference signal;
   a lock indicator for determining a lock state of the phase lock loop;
   a phase detector that is coupled to the lock indicator and the counter for determining a frequency difference and a phase difference between the reference signal and the oscillating signal from the digitally controlled oscillator;
   a digital signal processing loop filter; and
   a phase booster,
   wherein the digital signal processing loop filter is coupled to the phase detector and the phase booster, and the digital signal processing loop filter for receiving input signals and exporting an output signal to the digitally controlled oscillator under control,
   wherein the phase booster changes an operating efficiency of the digital signal processing loop filter.

2. The phase lock loop in claim 1, wherein the counter further comprises a function for dividing a count value responsive to an inputted signal.

3. The phase lack loop in claim 1, wherein the phase detector further comprises a function for determining a closest rising edge of an output signal of the digitally controlled oscillator when compared with a rising edge of the reference signal.

4. The phase lock loop in claim 1, wherein the digital signal processing loop filter receives an external input.

5. A method for increasing a speed of phase acquisition in a phase lock loop, the method comprising:
   determining a phase difference and a frequency difference of an outputted signal from the phase lock loop in comparison with a reference signal;
   comparing a position of a rising edge of the reference signal with a rising edge and a falling edge of the outputted signal;
   determining a closest rising edge of the outputted signal from an output oscillator to the rising edge of the reference signal; and
   maintaining a consistent outputted signal during reference signal variations by:
      applying a coast signal when the reference signal variations occur;
      applying a HOLD signal for keeping the outputted signal at a current value unresponsive to frequency and phase changes in the reference signal;
      removing the coast signal and the HOLD signals after the reference signal variations have ceased; and
      applying a phase booster signal, wherein the phase booster signal increases a rate at which reacquisition of phase/frequency lock can occur.

6. The method of claim 5, further comprising:
   counting a number of cycles of a generated clock signal as a generated clock count in one reference clock cycle of a reference clock signal;
   determining a position of a rising edge of the reference clock signal in comparison with a rising and a falling edges of the generated clock signal;
   adjusting a LOCK state by comparing the rising edge of the reference clock signal and the generated clock count; and
   adjusting the phase of the generated clock signal responsive to the lock state and then determining a position of the rising edge of the reference clock signal.

7. The method of claim 6 further comprising the steps of:
   applying a coast signal when the reference signal variations occur;
   holding a digitally controlled oscillator at a last stable value;
   removing the coast signal when the reference signal returns to a normal operation condition; and
   increasing a speed, at which phase adjustments occur during phase-reacquisition.

* * * * *